(12) United States Patent
Martin et al.

(10) Patent No.: US 12,249,361 B2
(45) Date of Patent: Mar. 11, 2025

(54) METHOD FOR FABRICATING A MAGNETORESISTIVE ELEMENT COMPRISING DISCONTINUOUS INTERCONNECT SEGMENTS

(71) Applicant: CENTRE NATIONAL DE LA RECHERCHE SCIENTIFIQUE, Paris (FR)

(72) Inventors: Sylvain Martin, Grenoble (FR); Julien Louche, Saint-Martin-le-Vinoux (FR); Marc Drouard, Valence (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 562 days.

(21) Appl. No.: 17/204,678

(22) Filed: Mar. 17, 2021

(65) Prior Publication Data

US 2021/0295887 A1 Sep. 23, 2021

(30) Foreign Application Priority Data

Mar. 17, 2020 (EP) .................................... 20315039

(51) Int. Cl.
*G11C 11/16* (2006.01)
*H10B 61/00* (2023.01)
(Continued)

(52) U.S. Cl.
CPC ........ *G11C 11/161* (2013.01); *G11C 11/1675* (2013.01); *H10B 61/00* (2023.02);
(Continued)

(58) Field of Classification Search
CPC ............ G11C 11/16–161; G11C 11/04; G11C 11/1675; H10B 61/00; H10B 61/10;
(Continued)

(56) References Cited

U.S. PATENT DOCUMENTS

| 6,238,582 | B1 * | 5/2001 | Williams | .................. | C23F 4/00 |
| | | | | | 216/22 |
| 9,941,468 | B2 * | 4/2018 | Fukami | .................. | G11C 11/18 |

(Continued)

FOREIGN PATENT DOCUMENTS

WO WO-2019005156 A1 * 1/2019
WO WO-2019125387 A1 * 6/2019

OTHER PUBLICATIONS

Sung-Woon Cho, ECS Journal of Solid State Science and Technology, 2014, by The Electrochemical Society, vol. 3(11), pp. Q215-Q220 (2014) (Year: 2014).*

(Continued)

*Primary Examiner* — Marcos D. Pizarro
(74) *Attorney, Agent, or Firm* — Blank Rome LLP

(57) ABSTRACT

The present disclosure concerns a method for fabricating a magnetoresistive element comprising a magnetic tunnel junction including a tunnel barrier layer, a first ferromagnetic layer and a second ferromagnetic layer; a writing current layer; and an interconnect layer configured for supplying the writing current to the writing current layer. A gap is provided in the interconnect layer such that the latter comprises two discontinuous interconnect segments extending along a layer plane and connecting the writing current layer in series. The method comprises: depositing the interconnect layer, writing current layer, second ferromagnetic layer, tunnel barrier layer and first ferromagnetic layer; forming the gap in the interconnect layer; filling the gap with the gap material; and forming the pillar by performing a single etch step until the interconnect layer, acting as a stop layer, is reached.

11 Claims, 6 Drawing Sheets

(51) Int. Cl.
   *H10N 50/01*   (2023.01)
   *H10N 50/10*   (2023.01)
   *H10N 50/80*   (2023.01)
   *H10N 50/85*   (2023.01)
   *H10N 59/00*   (2023.01)

(52) U.S. Cl.
   CPC ............ *H10B 61/10* (2023.02); *H10N 50/01* (2023.02); *H10N 50/10* (2023.02); *H10N 50/80* (2023.02); *H10N 50/85* (2023.02); *H10N 59/00* (2023.02)

(58) Field of Classification Search
   CPC ........ H10N 50/01; H10N 50/20; H10N 50/80; H10N 50/10–85; H10N 59/00
   USPC ............................................................ 438/3
   See application file for complete search history.

(56) References Cited

U.S. PATENT DOCUMENTS

| | | | |
|---|---|---|---|
| 11,532,782 B2 * | 12/2022 | Lee | H10B 61/00 |
| 11,574,666 B2 * | 2/2023 | Gosavi | H01F 10/329 |
| 2017/0069831 A1 * | 3/2017 | Nikonov | H10N 50/10 |
| 2019/0326353 A1 * | 10/2019 | O'Brien | H01F 10/3254 |
| 2019/0386203 A1 * | 12/2019 | Gosavi | H10N 50/01 |
| 2020/0083429 A1 * | 3/2020 | Lee | H10N 50/10 |

OTHER PUBLICATIONS

European Search Report for EP Application No. EP 20315039, dated Aug. 31, 2020, 4 pgs.

* cited by examiner

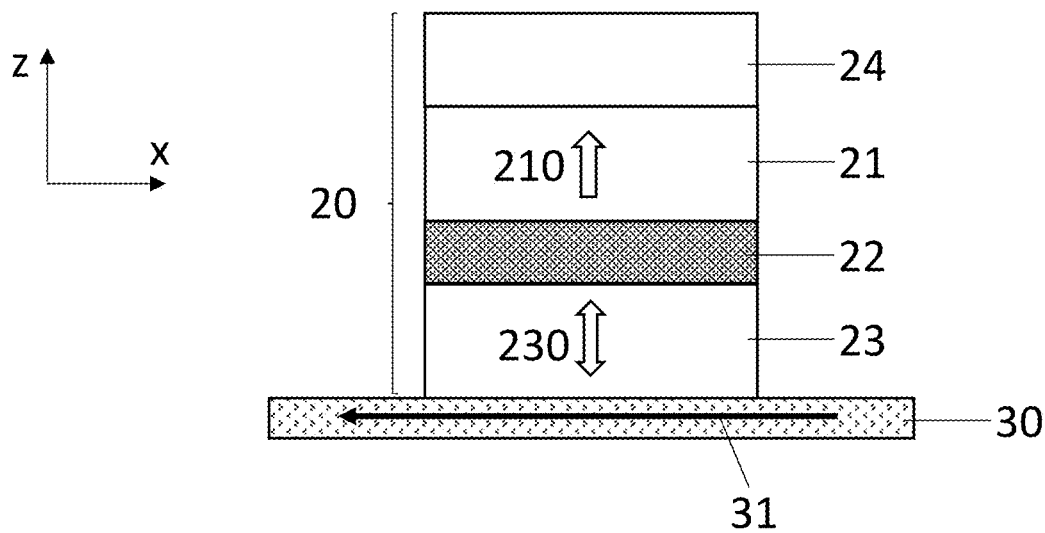
Fig. 1        PRIOR ART
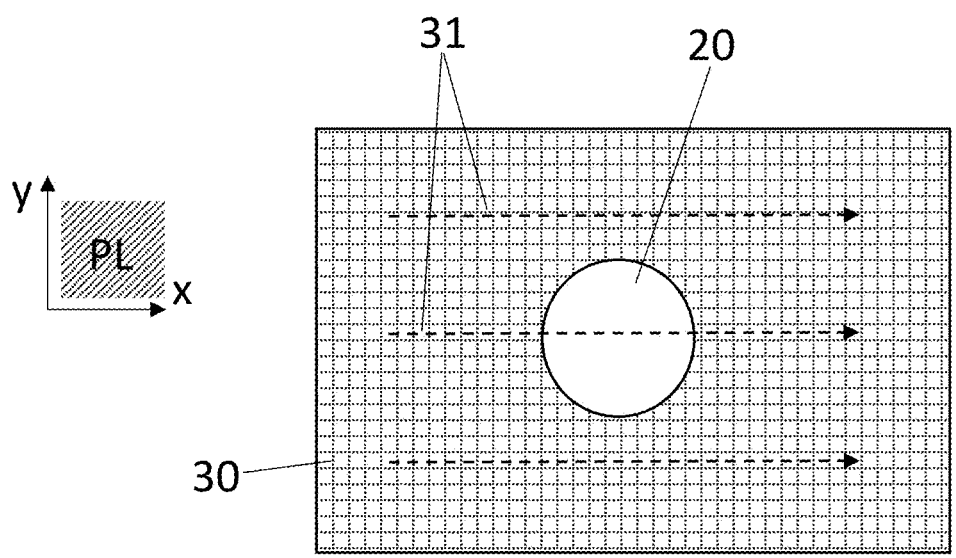
Fig. 2        PRIOR ART

METHOD FOR FABRICATING A MAGNETORESISTIVE ELEMENT COMPRISING DISCONTINUOUS INTERCONNECT SEGMENTS

RELATED APPLICATION

This application claims the benefit of European Application No. EP20315039.6, filed on Mar. 17, 2020. The entire content of this application is hereby incorporated by reference.

TECHNICAL DOMAIN

The present invention relates to a magnetoresistive element and more particularly a magnetoresistive element that has increased efficiency of the writing current and that is simpler to fabricate. Also disclosed is a method for fabricating a magnetoresistive element. The present invention further relates to a magnetic memory comprising a plurality of the magnetoresistive element.

RELATED ART

FIG. 1 shows a side view of a conventional magnetoresistive memory cell comprising a magnetic tunnel junction MTJ 20 including a tunnel barrier layer 22 sandwiched between a first ferromagnetic layer 21 having a first magnetization 210 and a second ferromagnetic layer 23 having a free second magnetization 230. The layer 24 can comprise an electrically conductive capping layer or an antiferromagnetic layer exchange coupling the first ferromagnetic layer 21 such as to pin the first magnetization 210. Alternatively, the capping layer 24 can comprise a SAF structure including a metallic non-magnetic spacer layer and a ferromagnetic layer. The magnetoresistive memory cell further comprises a current line 30 extending in a plane substantially parallel to the layers 21, 22, 23 of the MTJ 20 and contacting the second ferromagnetic layer 23. The second magnetization 230 can be switched (magnetization reversal) by passing a writing current 31 in the current line 30. Switching of the second magnetization 230 can be performed by a spin orbit torque (SOT) interaction. The spin current generated by spin Hall effect and/or Rashba-Edelstein effect by writing current 31 exerts a torque on the initial orientation of the second magnetization 230 so that the orientation of the second magnetization 230 can be changed, for example, from being parallel to antiparallel to the first magnetization 210

The SOT based switching allows for using separate read- and write-paths which is beneficial for a long life of the memory cell. In the case the magnetizations 210 and 230 are perpendicular to the plane of the layers 21, 23 (as shown in FIG. 1), an in-plane magnetic field (not shown) has to be applied in addition to the writing current 31 in order to deterministically switch the second magnetization 230.

FIG. 2 shows a top view of the conventional cell of FIG. 1. The current line 30 is extends in the "x-y" plane around the MTJ 20. As represented in FIG. 2, the writing current 31 flowing in the current line 30 does not all flows underneath the MTJ 20. The effective current of the writing current 31 used for switching the second magnetization 230 is increased since the writing current 31 is evenly distributed over the width of the current line 30 and only a fraction of the writing current 31 passing below the MTJ 20 is used for the switching. Fabricating the conventional cell where the current line 30 has a width that is similar to the lateral dimension of the MTJ 20 is difficult. One reason is that the alignment of the MTJ 20 with the current line 30 width is complicated to achieve.

On the other hand, the conventional magnetoresistive memory cell shown in FIGS. 1 and 2 is usually manufactured by etching the MTJ 20 until the current line 30 is reached. Here, the current line 30 serves as a etch stop layer. Since the current line 30 is typically very thin, between 1 and 10 nm, the etching process needs to be very precise.

Document US2019326353 discloses a SOT memory device including an SOT electrode on an upper end of an MTJ device. The MTJ device includes a free magnet, a fixed magnet and a tunnel barrier between the free magnet and the fixed magnet and is coupled with a conductive interconnect at a lower end of the MTJ device. The SOT electrode has a footprint that is substantially the same as a footprint of the MTJ device. The SOT device includes a first contact and a second contact on an upper surface of the SOT electrode. The first contact and the second contact are laterally spaced apart by a distance that is no greater than a length of the MTJ device.

SUMMARY

The present disclosure concerns a method for fabricating a magnetoresistive element, comprising: a MTJ comprising a tunnel barrier layer sandwiched between a first ferromagnetic layer having a first magnetization, a second ferromagnetic layer having a second magnetization, and a writing current layer contacting the second ferromagnetic layer and configured for passing a writing current adapted for switching the second magnetization by a SOT interaction; an interconnect layer contacting the writing current layer and configured for supplying the writing current to the writing current layer; the interconnect layer comprising a gap configured such that the interconnect layer comprises two discontinuous interconnect segments extending along a layer plane substantially parallel to the layers of the MTJ, the interconnect segments connecting the writing current layer in series. The method comprises the steps of: depositing the interconnect layer, writing current layer, second ferromagnetic layer, tunnel barrier layer and first ferromagnetic layer; forming the gap in the interconnect layer; filling the gap with the gap material; and forming the pillar by performing a single etch step until the interconnect layer, acting as a stop layer, is reached.

The present disclosure concerns a magnetoresistive element obtained by the method.

With respect to what is known in the art, the magnetoresistive element provides an increased efficiency of the writing current since the writing current used for switching the second magnetization by a SOT interaction flows only underneath the second ferromagnetic layer. Because there is substantially no shunting of the writing current by a portion of the writing current layer that is not underneath the MTJ, the writing current can be reduced. Moreover, the gap between the interconnect segments forces the writing current to flow completely in the writing current layer.

Thanks to the large size of the interconnect layer with respect to the size of the MTJ, the dimensional constraint along the width of the gap can be relaxed. The MTJ need to be precisely positioned only along a direction perpendicular to the width of the gap. Constraint along the direction perpendicular to the width of the gap can be possibly released depending on the shape of the MTJ.

During the manufacturing process, the MTJ can be etched with the writing current layer until the interconnect layer is reached. The interconnect layer is thus used as the stop etch layer. Since the interconnect layer can be much thicker than the thin writing current layer, the control of the etching process can be simplified and variations between different fabricated magnetoresistive elements can be reduced. The magnetoresistive element is then easier to fabricate. Moreover, oxidation or deterioration of the writing current layer during the next process steps can be avoided.

Another advantage of the magnetoresistive element disclosed herein is that the interconnect layer can have a lower electrical resistance than the one of the writing current layer so that less heating occurs during the write/read operations. The lower electrical resistance along the current path allows for reducing the total energy needed to apply a current high enough to switch the second magnetization.

Yet another advantage is that the thickness of the writing current layer can be reduced compared to the writing current layer thickness of a conventional magnetoresistive element. In fact, the thickness of the current layer does not need to be controlled for the etching process and can be optimized for the passing writing current.

SHORT DESCRIPTION OF THE DRAWINGS

Exemplar embodiments of the invention are disclosed in the description and illustrated by the drawings in which:

FIG. 1 shows a side view of a conventional magnetoresistive memory cell;

FIG. 2 shows a top view the conventional magnetoresistive memory cell of FIG. 1;

EXAMPLES OF EMBODIMENTS

Figure 3:
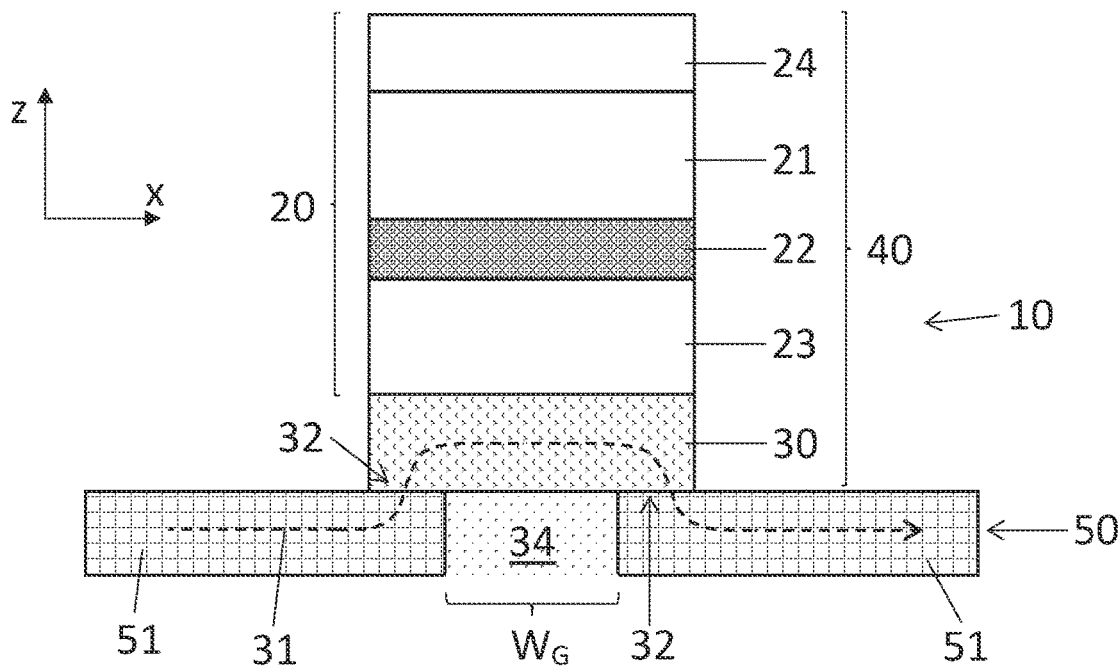
FIG. 3 shows a side view of a magnetoresistive element, according to an embodiment.
Figure 4:
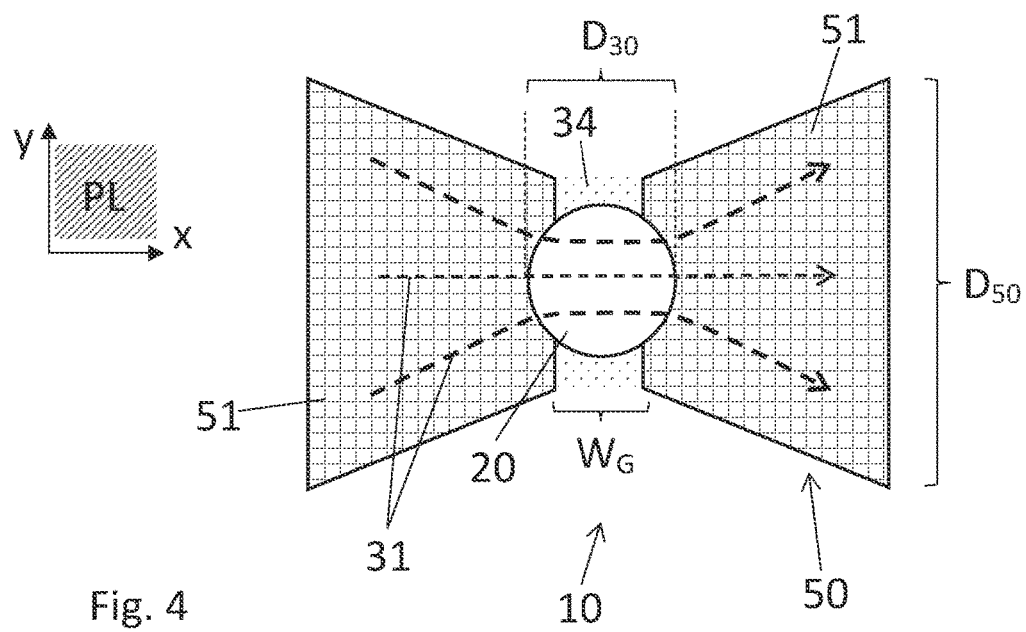
FIG. 4 shows a top view of the magnetoresistive element, according to an embodiment.

FIG. 3 shows a side view and FIG. 4 shows a top view of a magnetoresistive element 10 according to an embodiment. The magnetoresistive element 10 comprises a MTJ 20 comprising a tunnel barrier layer 22 sandwiched between a first ferromagnetic layer 21 having a first magnetization 210, a second ferromagnetic layer 23 having a second magnetization 230.

In an embodiment, the first and second ferromagnetic layers 21, 23 can comprise a ferromagnetic material including a metal or alloy having a specific perpendicular magnetic anisotropy whereby the first and second magnetizations 210, 230 are oriented substantially perpendicular to the plane of the ferromagnetic layers 21, 23 (out-of-plane, also known as perpendicular magnetic anisotropy (PMA)). Such metal or alloy can comprise FePt, FePd, CoPt, or a rare earth/transition metal alloy, in particular GdCo, TdFeCo, or Co, Fe, CoFe, Ni, CoNi, CoFeB, FeB. Alternatively, the first and second ferromagnetic layers 21, 23 can comprise a metal or alloy with the first and second magnetizations 210, 230 being oriented parallel to the plane of the ferromagnetic layers 21, 23 (in-plane). Such metal or alloy can comprise Co, Fe, CoFe, Ni, NiFe, CoNi, CoFeB, FeB. The thickness of the first and second ferromagnetic layers 21, 23 can be between 0.5 nm and 10 nm and preferably between 1 and 3 nm.

The MTJ 20 can further comprise a capping layer 24. The capping layer 24 can comprise an antiferromagnetic layer exchange coupling the first ferromagnetic layer 21 such as to first magnetization 210 such as to pin the first magnetization 210 in a particular direction. Alternatively, the capping layer 24 can comprise a SAF structure including a metallic non-magnetic spacer layer and a ferromagnetic layer.

The tunnel barrier layer 22 can include a material, such as MgO or $Al_2O_3$.

The magnetoresistive element 10 further comprises a writing current layer 30 configured for passing a writing current 31 and an electrically conductive interconnect layer 50 destined to supply the writing current 31 to the writing current layer 30. The interconnect layer 50 can include an electrically conductive material such as Cu, W, Au, Ag, Fe, Pt, Al, Co, Ru, Mo, NiSi, carbon nano tubes (CNT), graphene or an alloy of these elements.

The writing current layer 30 contacts the second ferromagnetic layer 23 and is configured for passing a writing current 31 adapted for switching the second magnetization 230 by a SOT interaction. The writing current layer 30 comprises a SOT material, where the SOT material can include an electrically conductive material, such as Pt, W, Ir, Ru, Pd, Cu, Au, Bi, Hf, Se, Sb or of an alloy of these elements, or is formed of a stack of a plurality of layers of each of these metals. Alternatively, the current layer 30 can be made from an antiferromagnetic material. Examples of antiferromagnetic materials include alloys with a base of Mn such as IrMn, FeMn, PtMn, or alloys of these compounds such as PtFeMn. Alternatively, the current layer 30 can be made from a ferromagnetic material, such as Fe, Co, Ni or of an alloy of these elements. The writing current layer 30 has a thickness that ranges between 0.5 nm and 200 nm, more particularly between 0.5 nm and 100 nm, or less than 10 nm. Preferably, the writing layer 30 has thickness lying in the range 0.5 nm to 5 nm.

The writing current layer 30 has lateral dimension that are substantially the same as the one of the MTJ 20. Here, the lateral dimension is in a layer plane PL substantially parallel to the layers 21, 22, 23 of the MTJ 20 (along the directions "x" and "y" in FIGS. 3 and 4). The MTJ 20 including the writing current layer 30 forms a pillar 40.

The interconnect layer 50 contacts the writing current layer 30 and extends on each side of the writing current layer 30 and MTJ 20, such that the lateral dimension along the direction "y" of the interconnect layer 50 are much larger than the lateral dimension of the writing current layer 30 and the MTJ 20.

In one aspect, the interconnect layer 50 comprises a gap 34 underneath the MTJ 20. In the example of FIGS. 3 and 4, the gap 34 is represented as a slit underneath the MTJ 20, such that the interconnect layer 50 comprises two discontinuous interconnect segments 51 connecting the writing current layer 30 in series. The interconnect segments 51 extend along the layer plane PL.

As shown in FIG. 4, the gap 34 can be configured such that each of the interconnect segments 51 are in contact with a portion at the periphery of the writing current layer 30.

In an embodiment, the gap 34 can be configured to have a gap width $W_G$ being a factor of about 0.9 to 0.1 of the lateral dimension $D_{30}$ of the writing current layer 30.

The gap 34 can comprise a gap material that is preferably an electrically insulating material. In other words, the gap 34 has an electrical conductivity being at least ten times smaller than that of the interconnect segments 51, such that substantially no current flows in the gap 34 but rather flows only in the interconnect segments 51 and the writing current layer 30.

The interconnect layer 50 can have any arbitrary shape as long as the above mentioned dimensional constrains are respected. In FIG. 4, the discontinuous interconnect segments 51 forming the interconnect layer 50 have a trapezoidal shape but could have a rectangular shape. The discontinuous interconnect segments 51 do not need to be aligned symmetrically with each other and a shift along the "y" axis can be tolerated as long as the interconnect segments 51 are in contact with a portion at the periphery of the writing current layer 30. Wide interconnect segments 51 (large size along the "y" axis) allows for decreasing the resistance of the interconnect layer 50.

In an embodiment, the interconnect layer 50 has an interconnect width $D_{50}$ (along the "y" axis in FIG. 4) that is larger than the gap width $W_G$. For example, the interconnect width $D_{50}$ can be at least 1.5 times the gap width $W_G$ or twice the gap width $W_G$.

In the configuration of the magnetoresistive element 10, all the writing current 31 flowing in the writing current layer 30 generated a spin current exerting a torque on the second magnetization 23 in order to switch it. The rest of the writing current 31 flows in the interconnect layer 50 that has a lower electrical resistance than the one of the writing current layer 30 so that less heating occurs during the write/read operations of the magnetoresistive element 10.

The pillar 40 can have a geometrically isotropic shape, for example a shape having substantially identical dimensions in the "x" and "y" directions, such a circular shape (as shown in FIG. 4) or a square shape. Alternatively, the pillar 40 can have a geometrically anisotropic shape, for example a shape having a larger dimension the "x-y" plane PL (called "long axis" afterwards). Examples of geometrically anisotropic shapes can include an ellipsoidal, a rectangular, a trapezoidal or a diamond shape.

Figure 5:
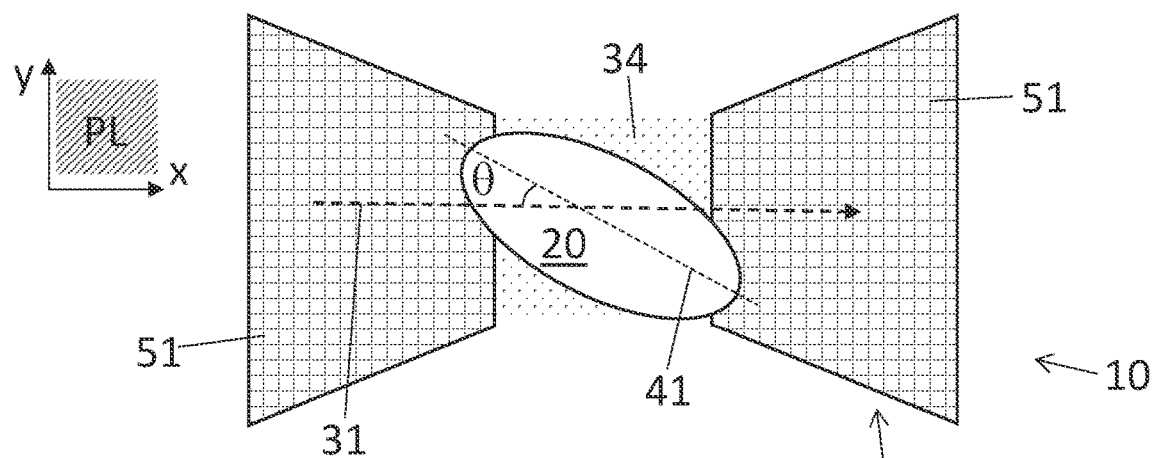
FIG. 5 shows a top view of the magnetoresistive element, according to another embodiment.

FIG. 5 shows a top view of the magnetoresistive element 10, wherein the pillar 40 has an ellipsoid shape. In one aspect, the long axis 41 of the ellipsoidal MTJ 20 can be parallel to the gap width $W_G$. Alternatively, the long axis 41 of the pillar 40 can be perpendicular to the gap width $W_G$ or can be oriented with any angle θ between 0° (parallel) and 90° (perpendicular) relative to the gap width $W_G$. For example, the long axis of the MTJ 20 can be oriented with any angle θ between 10° and 80° relative to the gap width $W_G$. When the ellipsoidal pillar 40 is oriented perpendicular or with an angle greater that 0°, the gap width $W_G$ can be larger, relaxing the fabrication constraint along the gap width $W_G$ (along the x axis). In the case where the first and second magnetizations 210, 230 are in-plane, the ellipsoidal pillar 40 oriented perpendicular or with an angle greater that 0° allows for breaking the symmetry. The orientation of the long axis as discussed in the example of FIG. 5 can be applied to any other geometrically anisotropic shapes.

Figure 6:
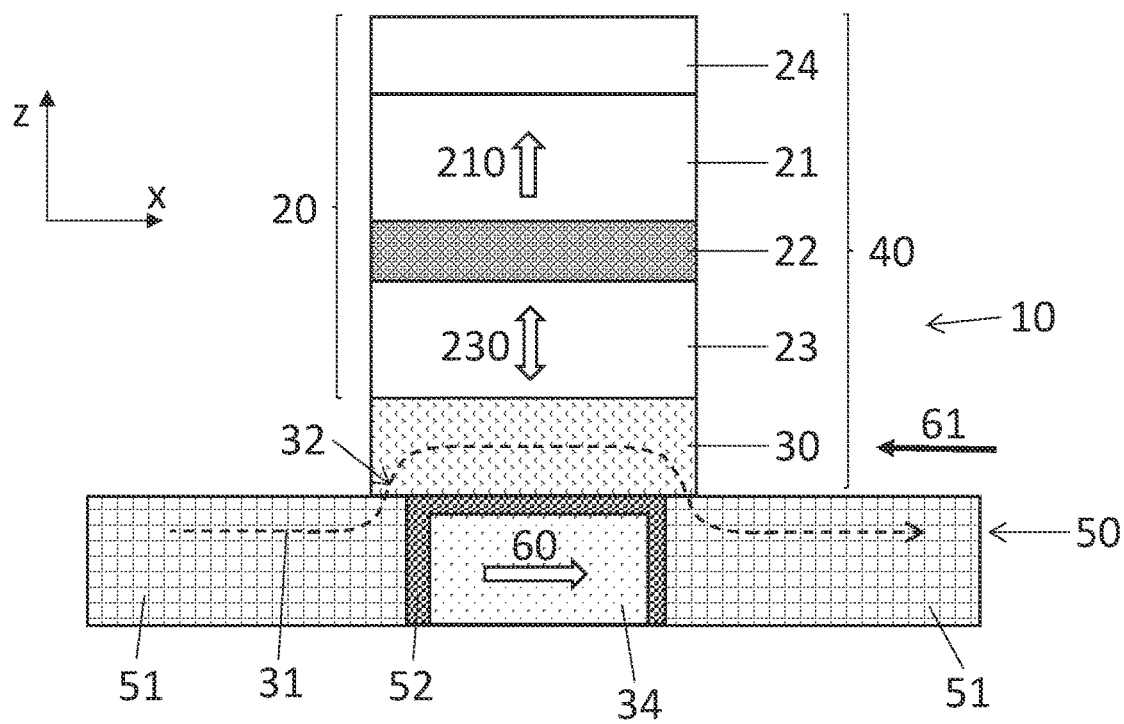
FIG. 6 shows a side view of a magnetoresistive element, according to yet another embodiment.

In an embodiment illustrated in FIG. 6, the gap material comprises a magnetic material having a bias magnetization 60 configured for breaking the symmetry, i.e., to provide a magnetic bias field 61 adapted to interact with the second magnetization 230 such as to provide deterministically switching of the second magnetization 230 when the writing current 31 is passed. In the case the first and second magnetizations 210, 230 are out-of-plane, the bias magnetization 60 should be oriented in-plane (along the "x" axis).

The magnetic material can have a coercivity between a few hundred to few thousand Oe.

In one aspect, the gap magnetic material can comprise a ferromagnet material such as: Co, Fe, CoFe, Ni, NiFe, CoNi, CoPt, CoCrPt, CoCrTa, CoSm. In the case the gap magnetic material is electrically conductive, the interconnect layer 50 can comprise an electrically insulating spacer 52 between the gap 34, the interconnect segments 51 and the writing current layer 30.

The gap magnetic material can be electrically insulating and no electrically insulating spacer between the gap 34, the interconnect segments 51 and the writing current layer 30 is needed.

Figure 7:
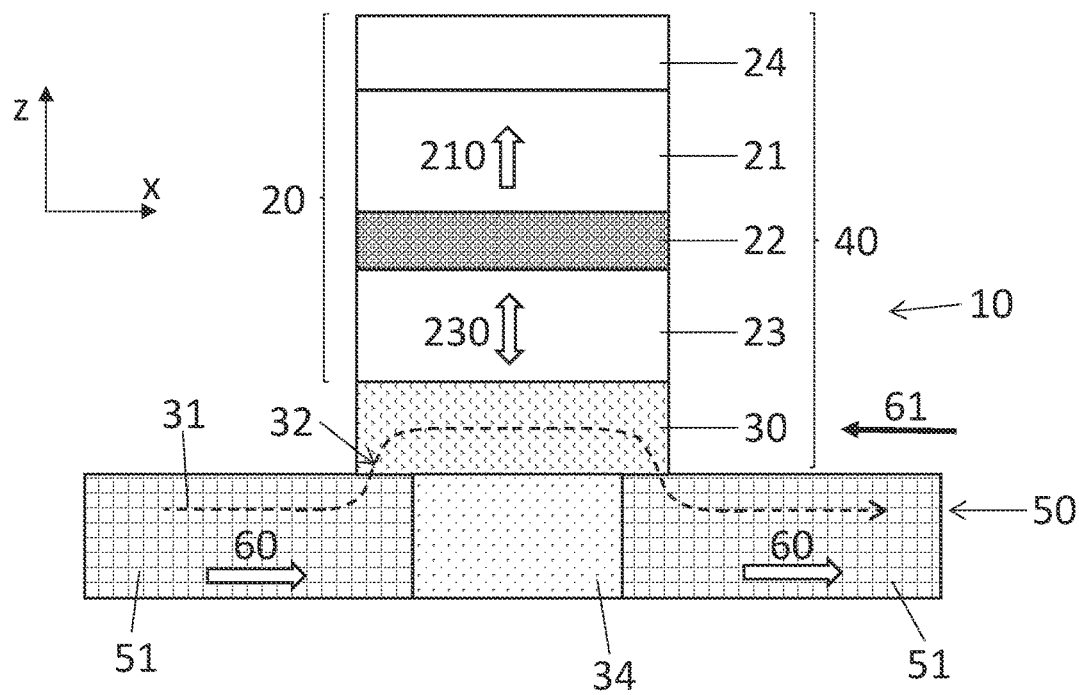
FIG. 7 shows a side view of a magnetoresistive element, according to yet another embodiment.

In another embodiment illustrated in FIG. 7, the interconnect layer 50 (the interconnect segments 51) comprises a ferromagnetic material (ferromagnet) having a bias magnetization 60 configured to provide a magnetic bias field 61 adapted to interact with the second magnetization 230 such as to provide deterministically switching of the second magnetization 230 when the writing current 31 is passed. In the case the first and second magnetizations 210, 230 are out-of-plane, the bias magnetization 60 should be oriented in-plane (along the "x" axis).

According to an embodiment (not illustrated), a method for fabricating the magnetoresistive element 10 comprises successively depositing the interconnect layer 50, forming the gap 34 in the interconnect layer 50, depositing a gap layer comprising the gap material on top of the interconnect layer 50 such as to fill the gap 34, planarizing the gap layer such as to free the upper surface of the interconnect layer 50, successively depositing the writing current layer 30, second ferromagnetic layer 23, tunnel barrier layer 22, first ferromagnetic layer 21 and capping layer 24. The gap 34 can be formed by using lithographic and etching steps. Planarizing the gap layer can be performed by using a chemical mechanical polishing process or lithographic and etching steps.

The fabrication process further comprises forming the pillar 40 by performing a single etch step until the interconnect layer 50, acting as a stop layer, is reached. The etching step can be facilitated since a multi angle etch can be done to clean any redeposited metal on the sidewall of the pillar 40. For example, the etching step can start with a 35° etch then a lower angle etch.

In one aspect, the pillar 40 can have sidewalls substantially vertical or tapered. Here, vertical refers to a direction "z" that is perpendicular to a layer plane PL substantially parallel to the layers 21, 22, 23 of the MTJ 20.

During the fabrication process of the magnetoresistive element 10, the MTJ 20 can be positioned relative to the interconnect layer 50 with great precision in only one direction. In the example of FIG. 4, due to the large size of the interconnect width $D_{50}$ of the interconnect layer 50 (or the interconnect segments 51), the MTJ 20 needs to be precisely positioned along the "x" direction while the dimensional constraint along the "y" axis is low such that the MTJ 20 needs not be precisely positioned along the "y" axis.

In one embodiment, a magnetic memory 100 comprises a plurality of the magnetoresistive element 10, wherein each magnetoresistive element 10 is connected to another one via an interconnect segment 51.

Figure 8:
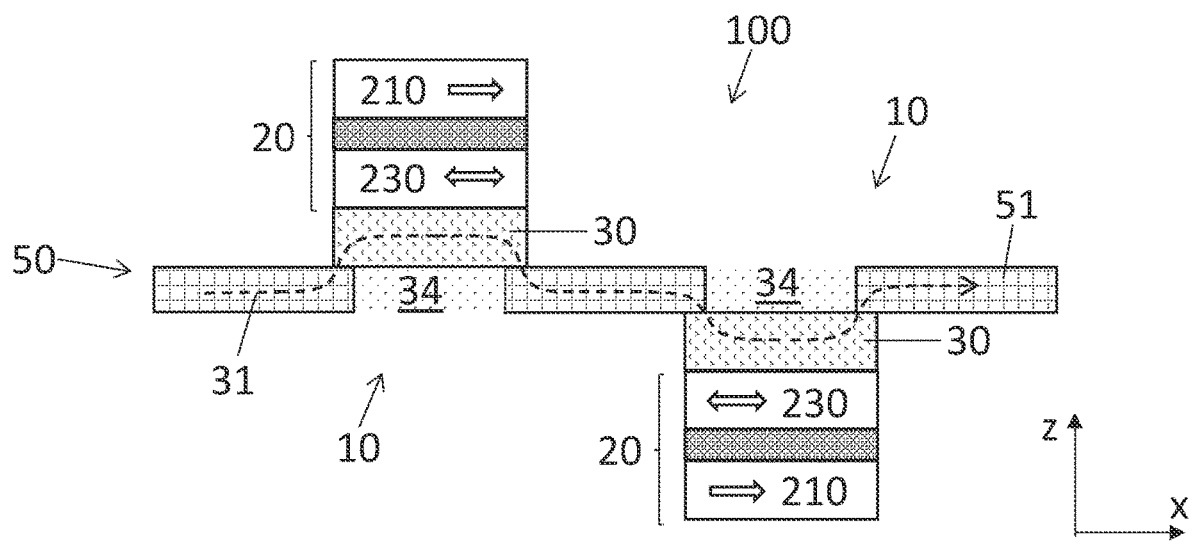
FIG. 8 shows a side view of a magnetic memory comprising a plurality of magnetoresistive elements, according to an embodiment.
Figure 9:
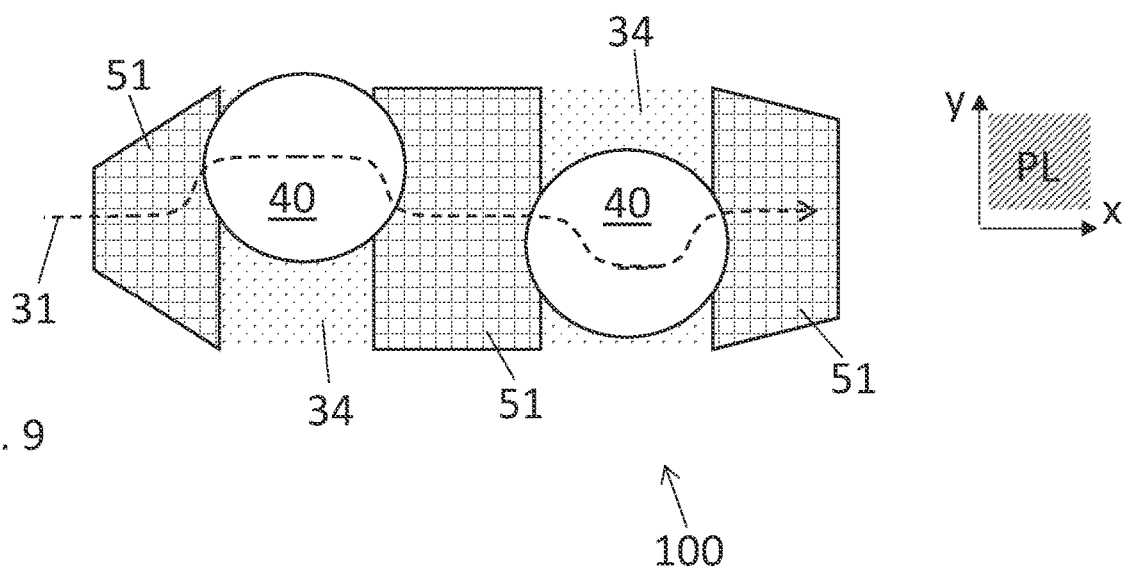
FIG. 9 shows a top view of a magnetic memory comprising a plurality of magnetoresistive elements, according to an embodiment.

FIG. 8 shows a side view of an exemplary magnetic memory 100 wherein the magnetoresistive element 10 connected along the interconnect layer 50 are connected alternatively above the layer plane PL and below the layer plane PL, such that two adjacent magnetoresistive elements 10 are above and below the layer plane PL. FIG. 9 shows a top view of the magnetic memory 100 of FIG. 8. This configuration allows for switching the second magnetization 230 of two adjacent magnetoresistive elements 10 in opposed orientation, such that the second magnetization 230 is parallel to the first magnetization 210 for one magnetoresistive element 10 and the second magnetization 230 is antiparallel to the first magnetization 210 for the adjacent magnetoresistive element 10, when the writing current 31 is passed in a direction in the interconnect layer 50. This configuration corresponds to a differential structure wherein two magnetoresistive elements 10 are written with the same current but with different magnetization configurations. The magnetoresistive elements 10 can be read separately and the magnetic state of the two magnetoresistive elements 10 can be compared. The first magnetization 210 is pinned in the same direction for the magnetoresistive elements 10.

In the configuration of FIGS. 8 and 9, the first magnetization 210 can be pinned in the same direction by using a single annealing step. More particularly, the MTJs 20 can be heated at a high temperature threshold at which the first magnetization 210 can be freely oriented. A programming magnetic field (not shown) is applied such as to orient the first magnetization 210 of the MTJs 20 in accordance to the programming magnetic field. The MTJs 20 are then cooled such as to pin the first magnetization 210 in the same programmed direction.

Figure 10:
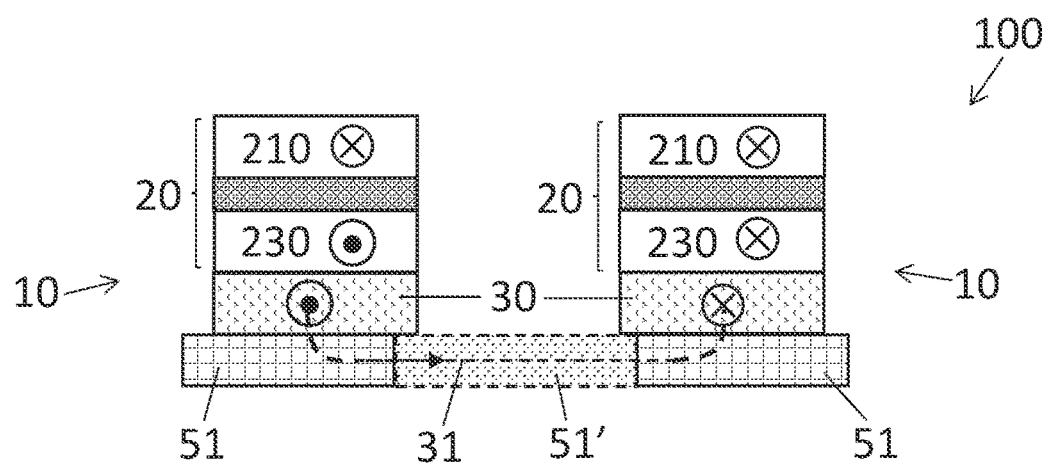
FIG. 10 shows a side view of a magnetic memory comprising a plurality of magnetoresistive elements, according to another embodiment.
Figure 11:
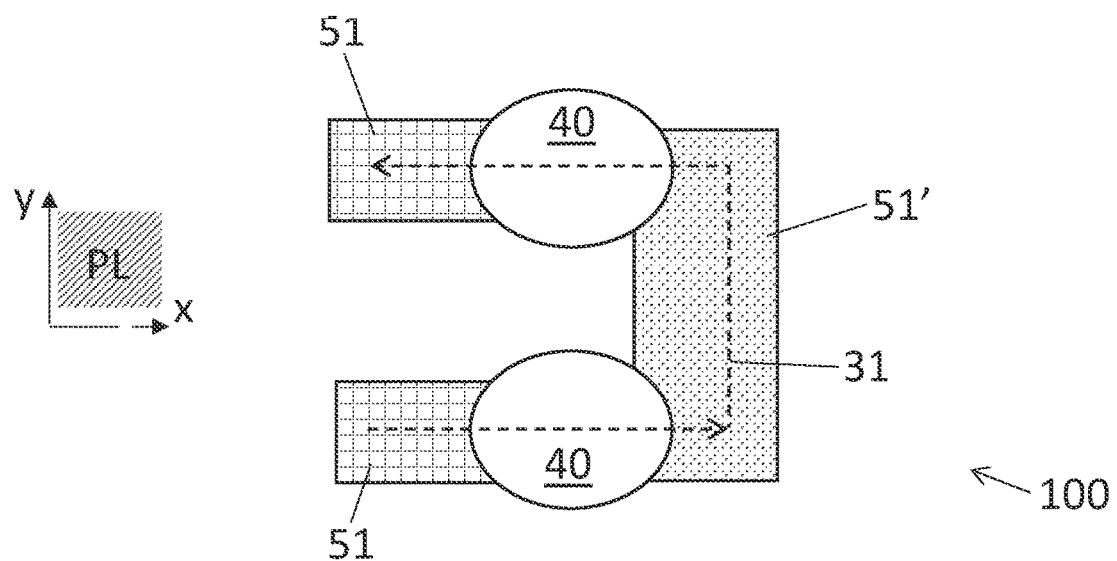
FIG. 11 shows a top view of a magnetic memory comprising a plurality of magnetoresistive elements, according to another embodiment.

FIG. 10 shows a side view and FIG. 11 shows a top view of another arrangement of the magnetic memory 100, wherein the magnetoresistive element 10 are connected along the interconnect layer 50 having a U shape configuration. The magnetoresistive elements 10 are connected above of the layer plane PL (the magnetoresistive elements 10 can also be connected below of the layer plane PL). In the arrangement shown in FIGS. 10 and 11, the interconnect layer 50 extends along a row in the layer plane PL, such that the writing current 31 flows in the writing current layer 30 of two adjacent magnetoresistive elements 10 in the row with opposed polarity. In FIGS. 10 and 11, the interconnect segment connecting the two adjacent magnetoresistive elements 10 is indicated by the numeral 51'. The magnetic memory configuration of FIGS. 10 and 11 also corresponds to a differential structure wherein two magnetoresistive elements 10 are written with the same current but with different magnetization configurations.

Figure 12:
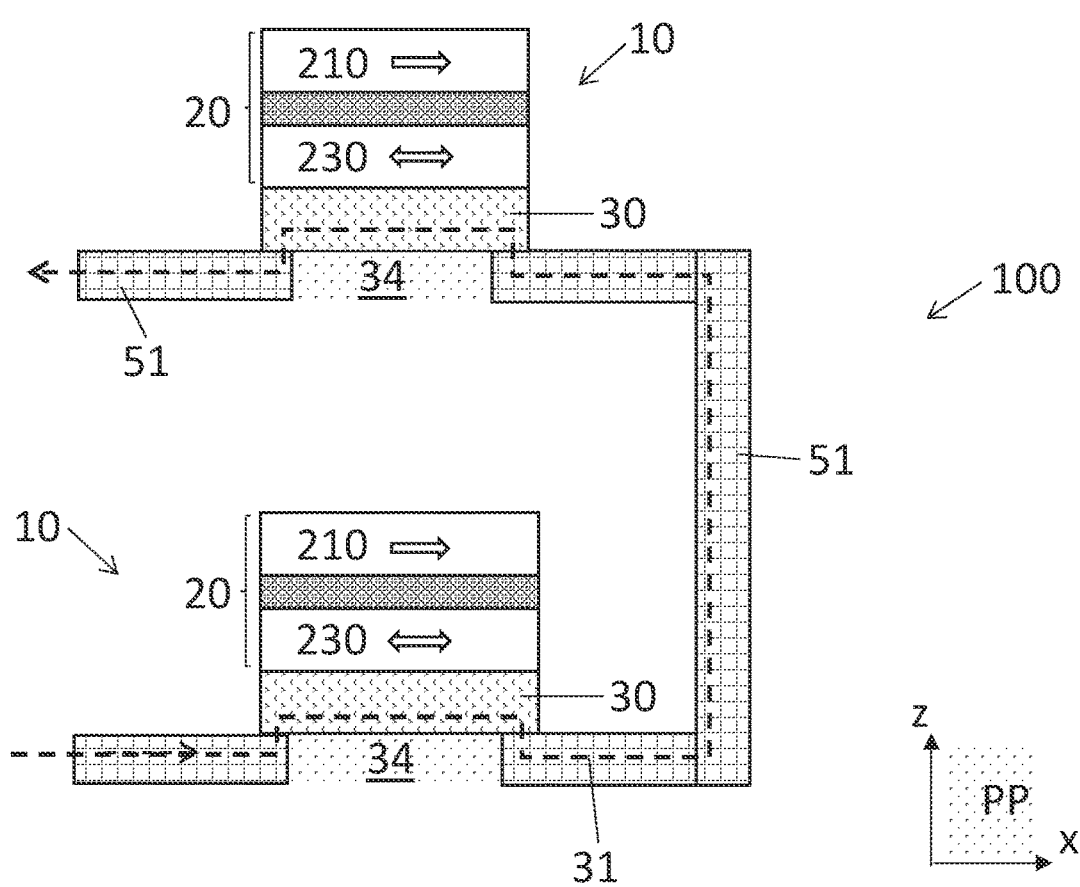
FIG. 12 shows a side view of a differential arrangement of the magnetic memory.

FIG. 12 shows a side view of yet another differential arrangement of the magnetic memory 100, wherein the interconnect layer 50 has a U shape configuration extending along a column in a perpendicular plane PP substantially perpendicular to the layer plane PL. The writing current 31 flows in the writing current layer 30 of two adjacent magnetoresistive elements 10 in the column with opposed polarity such that the second magnetization 230 of adjacent magnetoresistive elements 10 is oriented in opposite directions. In FIG. 12, the magnetoresistive elements 10 are connected above of the layer plane PL, but can also be connected below the layer plane PL.

REFERENCE NUMBERS AND SYMBOLS

10 magnetoresistive element
100 magnetic memory
20 MTJ element
21 first ferromagnetic layer
210 first magnetization
22 tunnel barrier layer
23 second ferromagnetic layer
230 second magnetization
24 capping layer
30 writing current layer
31 writing current
34 gap
40 pillar
41 long axis
50 interconnect layer
51, 51' interconnect segment
52 spacer
60 bias magnetization
61 magnetic bias field
θ angle
$D_{30}$ lateral dimension of the writing current layer
$D_{50}$ interconnect width
PL layer plane
PP perpendicular plane
$W_G$ width of the gap

The invention claimed is:

1. A method for fabricating a magnetoresistive element comprising a magnetic tunnel junction (MTJ) comprising a tunnel barrier layer sandwiched between a first ferromagnetic layer having a first magnetization and a second ferromagnetic layer having a second magnetization; a writing current layer extending in a layer plane substantially parallel to the layers the MTJ and contacting the second ferromagnetic layer, the writing current layer being configured for passing a writing current adapted for switching the second magnetization by a spin orbit torque interaction; and an interconnect layer configured for supplying the writing current to the writing current layer and in direct contact with the writing current layer; wherein the writing current layer has substantially the same lateral dimension in the layer plane than that of the MTJ such that the MTJ and the writing current layer form a pillar; and wherein a gap is provided in the interconnect layer such that the latter comprises two discontinuous interconnect segments extending along a layer plane and connecting the writing current layer in series;

the method comprising:
depositing the interconnect layer, writing current layer, second ferromagnetic layer, tunnel barrier layer and first ferromagnetic layer;
forming the gap in the interconnect layer;
filling the gap with the gap material;
forming the pillar by performing a single etch step until the interconnect layer, acting as a stop layer, is reached,
wherein filling the gap comprises depositing a gap layer comprising the gap material on top of the interconnect layer.

2. The method according to claim 1, further comprising planarizing the gap layer such as to free the upper surface of the interconnect layer.

3. The method according to claim 1, wherein the gap has a gap width between 0.9 and 0.1 the lateral dimension of the writing current layer.

4. The method according to claim 1, wherein the pillar has a geometrically isotropic shape.

5. The method according to claim 1, wherein the gap comprises a magnetic material having a bias magnetization configured to provide a magnetic bias field adapted to interact with the second magnetization such as to provide deterministically switching of the second magnetization when the writing current is passed.

6. The method according to claim 1, wherein the interconnect layer comprises a ferromagnetic material having a bias magnetization providing a magnetic bias field adapted to interact with the second magnetization such as to provide deterministically switching of the second magnetization when the writing current is passed.

7. The method according to claim 1, wherein the interconnect layer comprises an electrically conductive material such as Cu, W, Au, Ag, Fe, Pt, Al, Co, Ru, Mo, NiSi, carbon nano tubes, graphene or an alloy of these elements.

8. The method according to claim 1, wherein the gap is formed by using lithographic and etching process.

9. The method according to claim 8, wherein the single etch step is performed using a multi angle etch.

10. The method according to claim 1, wherein the pillar has a geometrically anisotropic shape.

11. The method according to claim 10, wherein a long axis of the pillar is parallel to the gap width, perpendicular to the gap width, or is oriented with an angle relative to the gap width.

\* \* \* \* \*